United States Patent [19]

Reed

[11] Patent Number: 4,577,157
[45] Date of Patent: Mar. 18, 1986

[54] ZERO IF RECEIVER AM/FM/PM DEMODULATOR USING SAMPLING TECHNIQUES

[75] Inventor: Joseph Reed, Stamford, Conn.

[73] Assignee: International Telephone and Telegraph Corporation, New York, N.Y.

[21] Appl. No.: 560,686

[22] Filed: Dec. 12, 1983

[51] Int. Cl.$^4$ .......................... H03D 3/18; H03D 3/00; H03D 5/00; H04B 1/16

[52] U.S. Cl. ........................................ 329/50; 329/103; 329/110; 329/124; 329/135; 375/82; 375/120; 455/214; 455/337

[58] Field of Search ............... 329/50, 101, 110, 103, 329/122, 124, 135, 136; 375/80, 81, 82, 120; 455/214, 337

[56] References Cited

U.S. PATENT DOCUMENTS

| | | | |
|---|---|---|---|
| 4,255,713 | 3/1981 | Yoshida | 375/81 X |
| 4,322,851 | 3/1982 | Vance | 375/80 X |
| 4,334,312 | 6/1982 | Yoshida | 375/81 X |
| 4,476,585 | 10/1984 | Reed | 329/50 X |
| 4,540,948 | 9/1985 | Ryu | 329/50 X |

Primary Examiner—Eugene R. LaRoche
Assistant Examiner—D. C. Mis
Attorney, Agent, or Firm—John T. O'Halloran; Peter R. Ruzek

[57] ABSTRACT

Apparatus is depicted which enables the sampling of the phase angle of a modulated signal and manipulates the sample signals to demodulate the same. The apparatus is particularly adaptable for use in demodulating the I and Q channel signals of a zero IF receiver. The system contains an angle sensing circuit which combines the I and Q channel signals in differential form to produce a series of output signals of an angular range indicative of the present value of the instanteous phase. The signals from the angle detector are coupled to an octant decoder which operates to determine the particular octant that the angle is to be included in. In the present system eight octants are used, each comprising 45°. The octant decoder determines which octant the angle belongs in and assigns a predetermined angle value to that angle. In one embodiment, the assigned angle values are 0°, 45°, 90°, 135°, 180°, 225°, 270° or 315°. The value of the assigned angles are then sampled by means of a clock at a high frequency rate whereby the resultant pulses indicative of the angles are then processed as differentiated to produce an output signal indicative of the information content on the original signal.

23 Claims, 10 Drawing Figures

ZERO IF RECEIVER AM/FM/PM DEMODULATOR USING SAMPLING TECHNIQUES

BACKGROUND OF INVENTION

This invention relates to a demodulator and more particularly relates to a sample data arrangement which enables FM or AM demodulation while the entire arrangement is capable of being implemented in integrated circuit form.

Due to the extensive use of integrated circuits, there has been an increased interest in zero frequency IF receivers. These are radio receivers in which the receive signal is mixed with a local oscillator at its own frequency so as to produce a set of signals at baseband from zero frequency to the modulation frequency band width. The zero IF technique has been described in British Pat. No. 1,530,602 entitled DEMODULATOR FOR FM SIGNALS published on Nov. 1, 1978 to I. A. W. Vance.

In regard to such systems, there has been difficulty with the technique in that the receive side bands which lie both above and below the carrier are "folded" about zero frequency so that they lie one upon the other in the frequency domain. This prohibits the modulation in all but the simplest of cases. In order to overcome this problem, it is necessary to use two local oscillators whose signals are in phase quadrature. By doing this, the system provides two channels in which the signals are out of phase by 90°. The use of two channels enables one to demodulate the desired signal.

As indicated, the above technique has been widely employed in the prior art and such systems require precise phase relationships as well as equal gain in each of the two channels. Based on system operation, the channels have to be balanced in regard to temperature, power and other variations. Thus the zero frequency IF receiver was not widely utilized until the advent of integrated circuits made it possible to provide balance based on common processing techniques and based on the fact that the various components could be integrated on common substrates. In spite of the progress made in integrated circuit technology, it was determined that many of the prior art receivers could not handle a wide variety of signals such as FM signals and tuned circuits were still required.

It is of course obvious that tuned circuits are difficult to implement in integrated circuit form. In any event, the prior art pursued the zero IF receiver and many techniques were developed which were capable of demodulating several different forms of signals and which were amenable to circuit integration. For example, reference is made to U.S. Pat. No. 3,937,899 entitled TONE DETECTOR USING SPECTRUM PARAMETER ESTIMATION by J. N. Denenberg issued on Feb. 10, 1976. See also U.S. Pat. No. 3,971,988 entitled AM/FM RECEIVER USING SPECTRAL PARAMETER ESTIMATERS issued on July 27, 1976 to J. N. Denenberg.

Apart from the above noted patents, there have been many other patents which relate to the demodulation of AM and FM or AM and PM signals including various forms of FSK as well as some forms of single sideband transmissions.

In reviewing the prior art, it will be seen that the earlier forms of these systems were analog in nature and although certain portions of the systems were capable of being integrated, they were extremely difficult to design and produce. The prior art has been concerned with the replacement of analog circuitry with digital techniques which, as is well known, are easy to integrate. The utilization of digital techniques involves the use of some form of analog to digital converter (A/D) which converts the analog signal to a digital code. The digital signal is then manipulated or processed in order to demodulate the information. Hence such techniques employ extensive look-up tables which are stored in memory and which encompass many bits of storage location.

Pursuant to this approach, the prior art attempted to reduce the storage requirements of memory by utilizing different modulation schemes such as a Sigma-Delta modulator or pulse density modulator which could employ a two-bit coding scheme and hence afford a reduction in the amount of storage necessary. In these systems, the signal was sampled and a value assigned to the phase angle of an FM signal in 45° increments. The output from the system represented the approximate signal and the accuracy was a function of the frequency of sampling. These methods were not capable of simultaneously demodulating an AM/FM signal without further manipulation.

Furthermore, the systems suffer in that they do not provide automatic gain control (AGC) nor could they provide compensation for mistuning or drift in the form of automatic frequency control (AFC). These systems required a set of pulse density modulators and controls as well as a look-up table which therefore resulted in an extremely difficult and complicated arrangement.

It is an object of the present invention to provide a sampling data system for a zero IF receiver which eliminates look-up tables and does not employ analog to digital converters but allows one to directly demodulate an AM or FM signal in a simple and reliable manner and employ circuitry which is capable of being easily integrated.

BRIEF DESCRIPTION OF THE PREFERRED EMBODIMENT

An apparatus for use in demodulating the information content in the I and Q channel signals of a zero IF receiving apparatus comprising angle sensing means responsive to said I and Q channel signals for providing at an output angle signals indicative of phase angles associated with said I and Q signals being within a specified range of angles, means responsive to said angle signals to provide an indication of which one of a plurality of octants each of said angle signals is in to specify said angle as one between 0° to 360° for assigning one of a plurality of predetermined angular values to said angles as indicative of said octant, and means responsive to said assigned angular values to provide at an output a demodulated signal.

DETAILED DESCRIPTION OF THE INVENTION

Before proceeding with a description of the Figures, it is indicated that there are two embodiments which will be described and with both embodiments directed towards techniques according to this invention.

Figure 1:
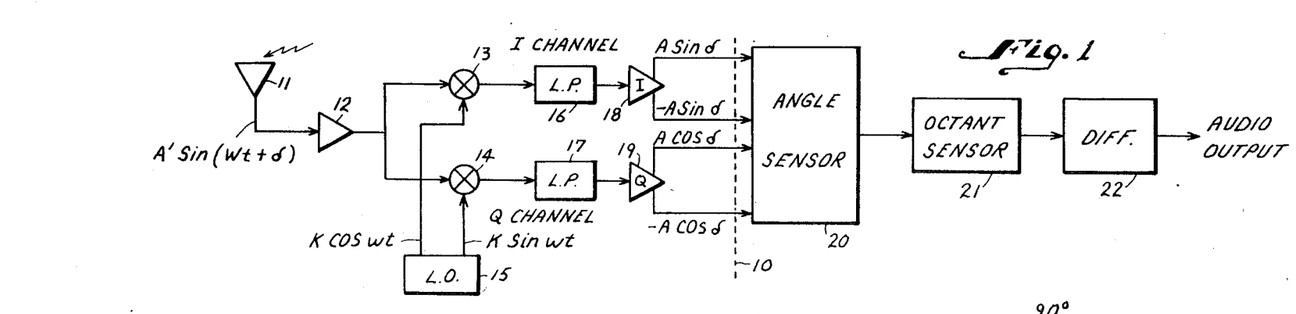
FIG. 1 is block diagram of an embodiment for a sampled data system according to this invention.

Referring to FIG. 1, the circuit components on the left side of the dashed line 10 constitute a basic zero frequency IF receiver and in order to understand some of the basic concepts of this invention, it is felt that a brief review of the receiver operation is warranted. A signal is received by antenna 11 and is amplified if necessary by means of the preamplifier 12. The signal is then split and coupled to the first inputs of a pair of identical mixers 13 and 14. This signal relationship is sometimes referred to by the word "quadrature". Based on the above operation, it can be seen that one of the two major mixing products at the output of mixer 13 is of the form $K \sin \delta$, the other products are at twice the carrier frequency so that the low pass filter 16 will only pass the signal with the form of $K \sin \delta$, while the mixer 14 and the associated low pass filter 17 will provide a signal of the form $K \cos \delta$. After amplification by amplifiers 18 and 19, there will be two signals, one in each channel.

The channels are designated as the I channel and the Q channel and the signals are as follows:

(1) channel I output $= A \sin \delta$ (2) channel Q output $= A \cos \delta$ where A is the signal amplitude, and $\delta$ is the time varying phase representing the desired modulating signal. In regard to this, the desired output is the rate of change of $\delta$ (delta) with respect to time or is as follows:

(3) $d\delta/d_t =$ desired output $= \Omega$

The $\Omega$ can be derived as follows and has been derived by prior art techniques using the following procedure. First the I signal is divided by the Q signal. The quadrant of the angle is determined by the signs of I and Q. The next step is to determine whether I is greater than Q or Q is greater than I. The result is that I divided by Q is equal to the $\tan \delta$ plus quadrant and indication of whether or not $\delta$ is greater than 45°. Then a look-up table is used to find the $\tan^{-1}\delta$. The circuit then operates to take successive differences in the value of $\delta$ at a rapid rate relative to the highest frequency component in $\delta$ in order to approximate the derivative indicated in Equation 3 above. The result is the desired modulation $\Omega$. In the prior art the two signals as from amplifiers 18 and 19 are entered into respective sample and hold circuits and sampled at a rate high enough to permit signal restoration. This rate is the Nyquist rate and is at least twice the highest frequency present in these signals. The samples are then coded into digital form and may, for example, consist of 8-bit words or better to provide adequate dynamic range. This conversion is typically performed by analog to digital conversions which operate on a logarithmic law so that the output digital numbers represent the logarithm of the input signal amplitude. The two digital signals are then subtracted whereby the resultant number respresents the $\log \tan \delta$. Each resultant sample is compared to a table of values for the inverse log tan and $\delta$ can be evaluated to a close approximation. The accuracy of the system depends on the number of bits in each A/D output and the fineness of the graduations stored in the look-up table.

In such systems a table of values for $\delta$ between 0° and 45° and an indication in which octant the angle exists may be found. This has been determined in the prior art by finding the relative size and signs of the $\sin \delta$ and $\cos \delta$ and has been implemented in the prior art by a complicated comparator circuit. The process series of output samples are then passed through a circuit which takes the difference between each pair of successive samples and passes it through a low pass filter and thence to a digital to analog (D/A) converter to provide the output. In such techniques the amplitude of the original signal is lost so that amplitude detection requires additional circuitry. Furthermore, the filtering becomes complicated and many additional filters have to be employed in order to get such systems to operate properly.

Referring back to FIG. 1, and as will be explained, amplifiers 18 and 19 are designed so that their outputs are differential in nature. Furthermore, both amplifiers 18 and 19 are relatively identical so that the quiescent voltages under no signal conditions are the same. The differential outputs from these amplifiers 18 and 19 are included as part of an angle sensor circuit designated in FIG. 1 as 20 and as will be explained. The output from the angle sensor circuit 20 is directed to the input of an octant determination circuit 21. This circuit, as will be explained, determines which octant the angle is in and therefore determines the relative magnitude of the angle which is being detected. The output from the octant determination circuit 21 is directed to a differentiator circuit 22 which provides at its output the desired audio signal. The differentiator circuit 22 includes a low pass filter to provide the final desired output, as will be more fully explained.

A primary object of the present invention is to quantize the angle even though it is time varying in larger increments and to take samples at a relatively rapid rate for accuracy. Essentially, the number of bits required to describe a waveform to a given accuracy can be reduced if the sample rate is correspondingly increased. For example, if $\delta$ is to be found to a 1° accuracy by sampling with 45° increments, one requires at least 45 samples taken at fixed time intervals of the actual angle. If $\delta$ were actually 44°, one would find that 44 samples at 45° and one sample at 0° would give a mean value of 1980 divided by 45° or 44°. Similarly, if the actual angle were 30°, one would require 30 samples at 45° and 15 samples at 0° for a total of 1350 which, when averaged over 45 total samples would give 30°. The problem then resolves itself to that of sampling the waveforms and determining if the angle is best approximated at each instant of sampling by either 0°, 45°, 90°, 135°, 180°, 225°, 270° or 315°. If these samples are taken sufficiently frequently and averaged, the result will be that $\delta$ is evaluated and hence the signal is effectively demodulated.

Figure 2:
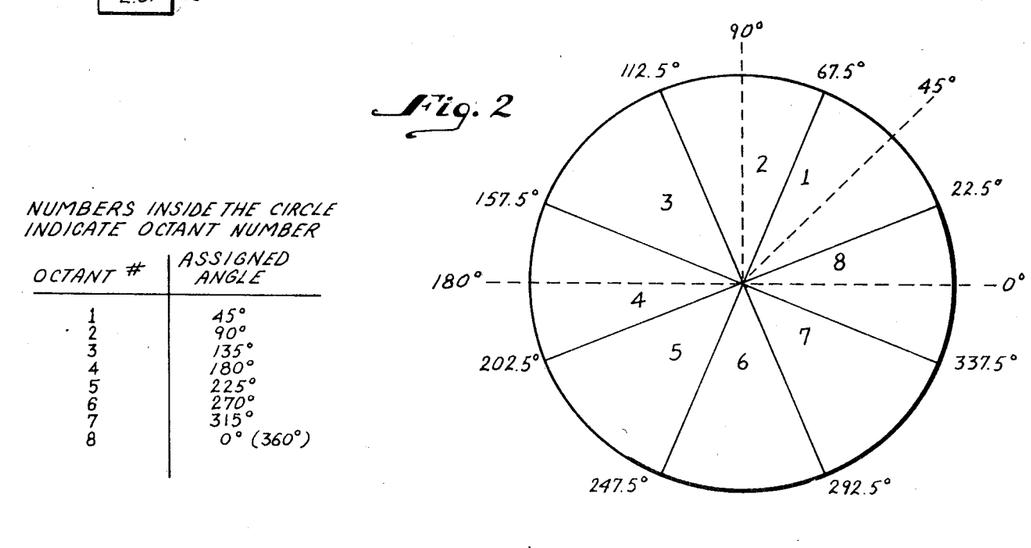
FIG. 2 is a graphic indication depicting octant selection in defining angles for demodulation.

Referring to FIG. 2, there is a diagrammatic view depicting a unit circle for any angle. In FIG. 2, the numbers inside the circle indicate the octant number. The angle indications adjacent each radius indicate the range. According to this procedure, it is assumed that the vector describing the angle can with equal probability occur anywhere around the circle. The following arbitrary quantization is employed.

Referring to FIG. 2, if the angle falls between 22.5° and 67.5° which is octant 1, it is assumed that the angle approximates 45°. Similarly, if the angle falls between 67.5° and 112.5°, the angle is approximated as 90°. Thus as can be seen from FIG. 2, the octants 1 to 8 as specified on the diagram approximate the respective angles as shown for each octant. Thus an angle between 22.5° and 337.5° in octant 8 is approximated as 0° and so on.

Figure 3:
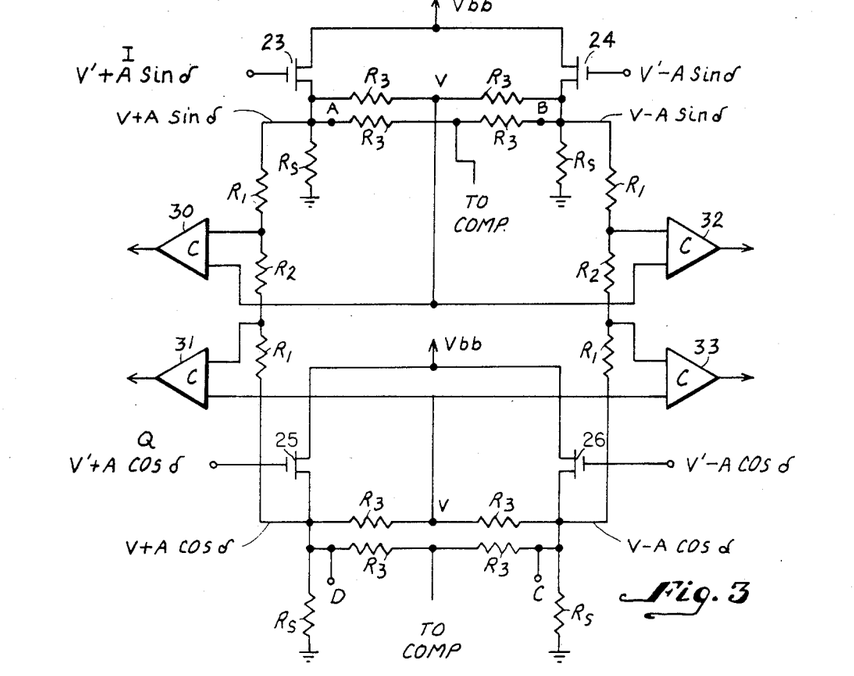
FIG. 3 is a detailed schematic diagram of an angle sensing circuit according to this invention.
Figure 4:
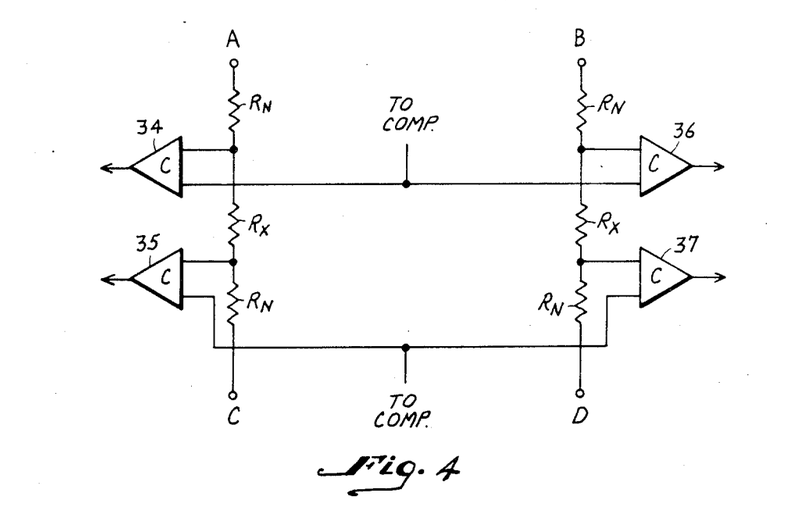
FIG. 4 is a schematic diagram showing additional circuitry to be employed with the angle sensing circuit of FIG. 3.

Referring to FIG. 3, there is shown a circuit which will perform the above noted approximations. The circuit in FIG. 4 shows a pair of source followers 23 and 24 which are shown as FETs. In any event, it is understood that bipolar transistors or any other active device may be employed in lieu of FETs. The FETs 23 and 24 have their source or drain electrodes connected together to a bias source designated as Vbb. The other electrodes (source or drain) are connected to ground through an equal resistance designated on the diagram as $R_s$. Coupled between the source electrodes is a divider constituting equal resistors designated as $R_3$. The gate electrode of each FET is respectively coupled to the I channel of FIG. 1.

Referring to FIG. 1, amplifier 18 which was indicated as part of the angle sensor circuit 20 is a differential amplifier which thereby produces two outputs. One output from the differential amplifier is applied to the gate electrode of FET 23 and the other output is applied to the gate electrode of FET 24. In a similar manner there is another pair of source follower connected FETs 25 and 26 which have their drain electrodes connectedtogether to the supply Vbb and their source electrodes connected together through the resistive divider consisting of resistors $R_3$. The gate electrodes of FETs 25 and 26 are connected to the differential amplifier 19 in the Q channel having the inputs to each FET indicated on FIG. 3.

The source electrode of FET 23 is connected to the source electrode of FET 25 via a resistive divider consisting of resistors $R_1$, $R_2$ and $R_1$. In a similar manner, the source electrode of FET 24 is connected to the source electrode of FET 26 through the resistive divider consisting of resistors $R_1$, $R_2$ and $R_1$. In order to simplify the explanation, it is further seen that there is an additional divider consisting of resistors $R_3$ coupled between points A and B. It is of course understood that this divider is in parallel with the first divider and therefore a single divider could be employed. Associated with the source electrodes of FETs 23 and 24 is another divider consisting of resistors $R_3$ coupled between terminals D and C associated with the source electrodes of FETs 25 and 26. As can be seen from FIG. 3, there is shown four comparators associated with the circuit as comparators 30, 31, 32, and 33. Comparator 30 has a first input terminal coupled between the junction of $R_1$ and $R_2$ associated with the source electrode of FET 23.

The other terminal of comparator 30 is connected to the junction between resistors $R_3$ and referenced by the voltage V. In a similar manner comparator 32 has a first input coupled to the junction between resistor $R_1$ and $R_2$ associated with the source electrode of FET 24 with the other input connected to the junction between resistors $R_3$ also designated by V. Comparators 31 and 33 are similarly connected as shown in FIG. 3. In order to simplify the diagram, there is a further voltage divider chain consisting of resistors $R_n$, $R_x$, $R_n$, ($R_1$, $R_2$, $R_1$) and shown in FIG. 4 which couples terminal A to C and a further divider which couples terminal B to terminal D. These dividers are associated with four additional comparators 34, 35, 36 and 37 each having one input connected to a junction between the resistors $R_n$ and $R_x$ with another input connected to the junction between the resistors $R_3$ designated as TO COMP. In this manner, there are shown eight comparators associated with the pairs of source followers which as indicated have inputs connected respectively to the I and Q channels via the differential amplifiers 18 and 19 of FIG. 1.

Based on a mathematical analysis of the action of the voltage dividers as $R_1$, $R_2$, $R_1$ between points A and D, it can be shown that the input to the upper comparator 30 is:

$$VIN = V + AK_1(\sin \delta + K_2 \cos \delta)$$

where $K_1 = \dfrac{R_2 + R_1}{R_2 + 2R_1}$ and $K_2 = \dfrac{R_1}{R_1 + R_2}$

The second input to this comparator 30 between the resistors $R_3$ is V. Therefore the difference is:

$$VIN - V = AK_1(\sin \delta + K_2 \cos \delta)$$

In a similar manner it can be seen that the lower comparator 31 provides a difference voltage which is:

$V_2 = AK_1(K_2 \sin \delta + \cos \delta)$ thus the comparators 30, 31, 32, 33, 34, 35, 36 and 37 will each provide a positive or high output where the input difference voltage is positive. Each comparator will provide no output or a low output when the input difference voltage is negative. There are many examples of comparators which are commercially available and which will operate accordingly and such comparators are available so that each can switch between the high and low state on a signal amplitude of 1 or 2 millivolts. It can be shown that one or more comparators will switch when either of the following conditions are satisfied:

$$(\pm \sin \delta \pm K_2 \cos \delta) > 0$$

or $$(\pm K_2 \sin \delta \pm \cos \delta) > 0$$

The comparators will provide an output as long as the above conditions are met. As an example, assume the following condition exists where:
 sin $\delta - K_2 \cos \delta > 0$
 then $+\tan \delta > K_2$ if $K_2 = 0.414$
 then $\tan \delta > \tan 22.5°$ or $\delta > 22.5°$
Thus the ratio of resistors $$\dfrac{R_1}{2R_1 + R_2} = .41$$

using this factor, it is seen that $(K_2 \sin \delta - \cos \delta) > 0$ and if $K_2 = 0.414$ then $\tan \delta > 1/K_2$ and $\delta$ must exceed 67.5° (90−22.5)

Based on the above formulas which determine comparator switching, it is shown that each of the forms indicates a range of δ over which a corresponding comparator will produce a positive output. Thus if $K_2$ is set to equal 0.414, the following tabulations are viable.

| Condition | Range of α (degrees) |
|---|---|
| G1 (sin α − 0.414 cos α) > 0 | 22.5 to 202.5 |
| G2 (sin α + .414 cos α) > 0 | 337.5 to 157.5 |
| G3 (− sin α + .414 cos α) > 0 | 202.5 to 22.5 |
| G4 (− sin α − .414 cos α) > 0 | 157.5 to 337.5 |

It will be noted that the range of δ for which a given comparator will produce an output is one half the unit circle and that reversing both signs (polarities) for a given inequality produces an output in the opposite half circle.

Similarly for the following comparators G5 to G8:

| Condition | Range of (degrees) |
|---|---|
| G5 (.414 sin α + cos α) > 0 | 292.5 to 112.5 |
| G6 (.414 sin α − cos α) > 0 | 67.5 to 247.5 |
| G7 (−.414 sin α + cos α) > 0 | 247.5 to 67.5 |
| G8 (−.414 sin α − cos α) > 0 | 112.5 to 292.5 |

Each of the ranges above represents one comparator providing an output.

Figure 5:
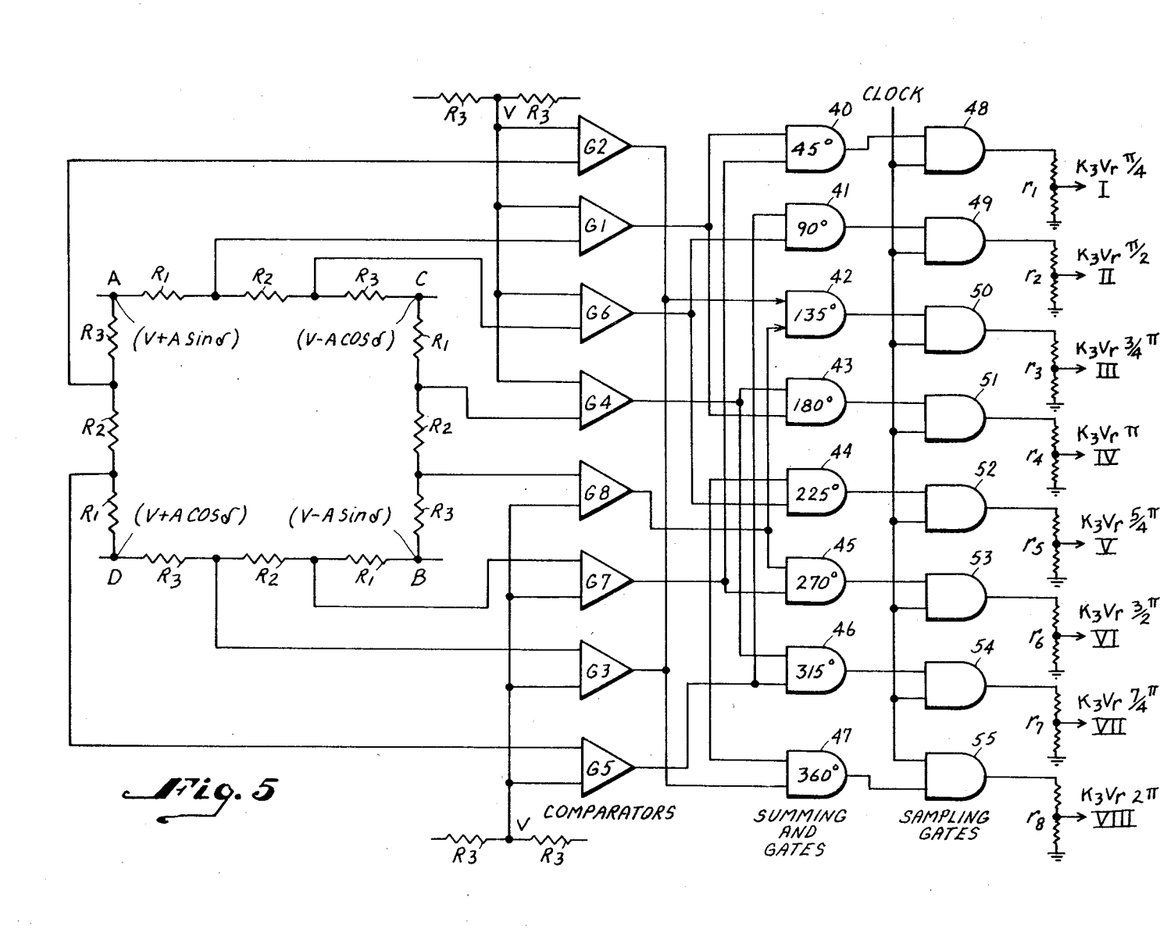
FIG. 5 is a detailed schmetic diagram of an octant determining circuit according to this invention.

Referring to FIG. 5, there is shown the respective voltage dividers of FIG. 4 located between points A, C, B and D. The output of each comparator as $G_1$ through $G_8$ which correspond to comparators 30 through 37 of FIGS. 3 and 4 are directed to inputs of associated AND gates 40 through 47. The comparators are designated as G1 to G8 to correlate with the condition tabulated above. Each AND gate as will be explained provides an output indicative of the octants 1 through 8 as indicated in FIG. 2. Each AND gate combines the comparators in pairs, as for example AND gate 40 has one input connected to comparator G1 and one input connected to the output of comparator G7. Thus the gate 40 will provide an output if, and only if, δ lies between 22 to 67.5°. This therefore assumes the approximation that δ is 45°. Thus the desired output from AND gate 40 is considered to be 45° or ζ/4 radians. Thus if one considers FIG. 5, one will immediately see that each of the gates 40 to 47 provide an output when δ is within any of the octants as shown in FIG. 2. The output of each AND gate as 40 to 47 is coupled to an input of an associated AND gate designated as gates 48 to 55. Each gate as gate 48 is a sampling gate and has one input connected to the output of the octant AND gate as gate 40 and another input connected to a source of clock pulses or sampling pulses. The rate of sampling is specified by the frequency of the clock pulses. The output of each gate as 48 to 55 is coupled to an associated voltage divider designated as r1 to r8. The outputs from each of the gates are shown on the diagram. The dividers determine the amplitude of the pulses and assign values in accordance with the quantized value of the angle δ as indicated by the octant selecting gates 40 to 47. The factor $K_3$ is a proportional factor which is based on the reference voltage VR. The reference voltage VR is the voltage level of the clock pulses.

Therefore, FIG. 5 is a respresentative circuit which will operate to provide the required octant and angle selection. It is, of course, understood that the sampling gates as 48 to 55 and the summing gates as 40 to 47 can be combined by suitable circuit design or kept separate for convenience of design and maintenance. Based on the above description, reference is again made to FIG. 3, where it is noted that two values of the voltage V are possible. This is the quiescent DC voltage which exists between resistors $R_3$. The two values are manifested by one from the I channel and one from the Q channel. A difference can be taken between these two voltages and applied to the amplifiers 18 and 19 of FIG. 1 in the proper polarity to provide negative feedback.

As indicated, amplifiers 18 and 19 are differential amplifiers and by applying the above noted voltage difference to the amplifiers, one can control the amplifiers to provide nearly identical values of V. This is based on the fact that these amplifiers are DC coupled and only DC feedback is being supplied due to the AC cancellation caused by the differential source followers. The error voltage can be provided by a comparator which compares the voltage V from the I and Q channels with a reference and the difference or error voltage is used to control the gain of the differential amplifiers 18 and 19. Thus in regard to FIG. 5, one can now ascertain that the values for the angle δ have been provided. Since only one output at a time occurs, the outputs of the gates 48 to 55 can be connected to a common summing point. This provides a series of pulses the amplitude of which varies in time as δ varies. One, therefore, has to differentiate or take the difference in amplitude between each succeeding pair of pulses to provide a smooth output which is indicative of Ω to provide the demodulated FM signal.

Figure 6:
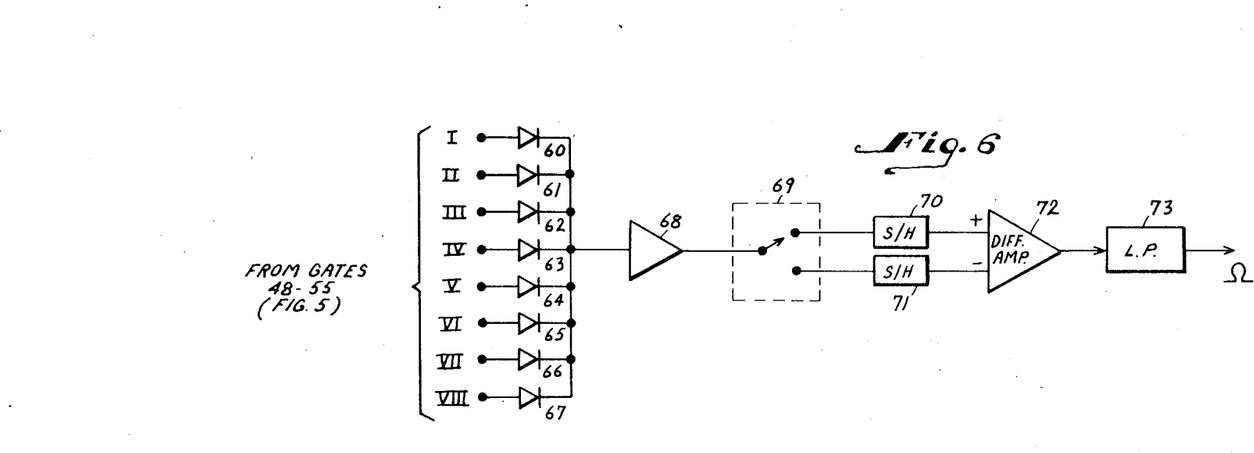
FIG. 6 is a block diagram of a circuit for obtaining successive differences for use in this invention.

Referring to FIG. 6, there is shown a differentiator circuit which can be employed for differentiator 22 shown in FIG. 1. Essentially, the outputs of each of the sample gates designated in FIG. 6 as I to VIII are summed.

In FIG. 6, the inputs I to VIII are each applied to the anode of a separate diode as 60 to 67 having their cathodes connected together at the input of an isolation amplifier 68. The output of amplifier 68 is directed to a switching circuit 69 which is controlled by the clock as for example the clock which produces the clock pulses for gates 48 to 55. The clock controlled switch alternates position at each pulse and switches the respective outputs between a first sample and hold circuit 70 and a second sample and hold circuit 71. The outputs of the sample and hold circuits 70 and 71 are directed to the inputs (inverting (−) and noninverting (+)) of a differential amplifier 72. The output of the differential amplifier 72 provides the desired signal Ω which is further applied to a low pass filter 73 to remove any additional frequency perterbations which may be due to the switching circuit 69. The differentiator depicted in FIG. 6 is relatively conventional and is well known.

The above described concept completely demodulates an FM signal as described but has certain disadvantages in that it does not demodulate an AM signal nor does the circuit automatically provide AFC. In any event, the circuit does eliminate a look-up table and memory and also eliminates the necessity for an analog to digital and a digital to analog converter.

Figure 7:
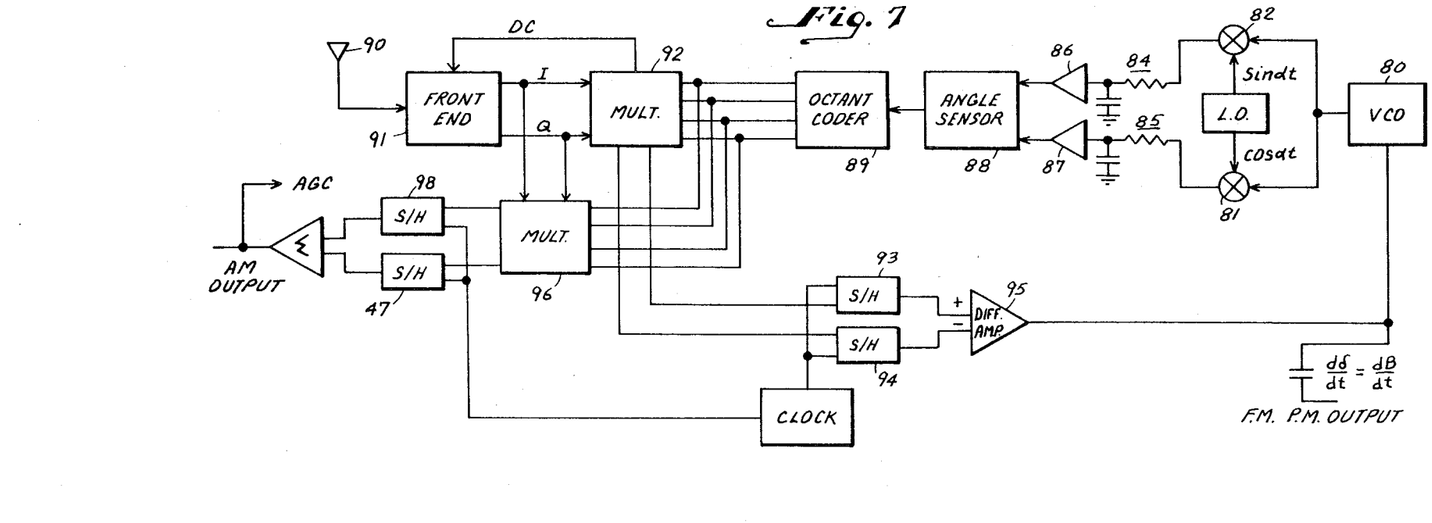
FIG. 7 is a block diagram of an alternate embodiment showing a quantized sample data feedback receiver according to this invention.

Referring to FIG. 7, there is shown an alternate embodiment of the invention which is capable of demodulating both AM, FM and PM signals utilizing some of the concepts as described above. Essentially, there is an alternate method of demodulating an FM signal in a zero frequency IF receiver. This is the subject matter of a copending patent application entitled A BASEBAND DEMODULATOR FOR FM filed on Jan. 25, 1982 as Ser. No. 342442, now U.S. Pat. No. 4,476,585, for J. Reed, the inventor herein.

According to that system, a voltage control oscillator (VCO) designated in FIG. 7 as 80 is tuned to a frequency $\alpha$ and is mixed with quadrature outputs from a fixed oscillator 81 via mixers 82 and 83 to produce signals which are filtered by low pass filters 84 and 85 which are simple RC networks. The local oscillator 81 is also tuned to frequency $\alpha$. According to this technique, the output of the low pass filters as present at the output of amplifiers 86 and 87 have the following form for for an I' and Q' channel, namely, I' channel signal = D sin $\beta$
Q' channel signal = D cos $\beta$ In any event, the above outputs from the I' and Q' channels are applied to circuit 88 of the same configuration as the circuit depicted in FIG. 3. The amplifiers 86 and 87 are differential amplifiers and apply the I' and Q' signals to the gate electrodes of the respective source followers. In a similar manner the input signal to antenna 90 is mixed with a local oscillator, filtered, and amplified by the front end circuitry 91 which is of the same configuration as that circuitry shown in FIG. 1 to the left of the dashed line 10.

The output of the front end circuitry is the I and Q channels as described above. These I and Q channels are directed to a circuit 92 where they are effectively multiplied by cos* $\beta$ and sin* $\beta$ which, as will be explained, are the sample quantized values derived from the angle sensor 88 and an octant coder 89 which will be further explained.

The octant coder 89 provides 4 output lines which, as will be explained, are applied to the multiplier 92. The output pulse trains from multiplier 92 are smoothed by sample and hold circuits 93 and 94 which have their outputs coupled to an output differential amplifier 95 and essentially perform the same function as the circuit shown in FIG. 6. The mathematical relationships before the sample and hold circuits is described as follows:

A(sin $\alpha$)(cos* $\beta$) − A(cos $\delta$)(sin* $\delta$)

after sample and hold:

A(sin $\delta$)(cos $\beta$) − A(cos $\delta$)(sin $\beta$) = A sin($\delta$−$\beta$) This is the form of signal required to close the loop and perform demodulation. The output signals from the octant coder 89 are also multiplied in proper sequence as will be explained by the multiplier 96. The output of the multiplier 96 is smoothed by sample and hold circuits 97 and 98 to provide at the output of differential amplifier 90 an AM output. Thus the circuit shown in block form in FIG. 7 is capable of simultaneously demodulating AM as well as FM or PM.

Figure 8:
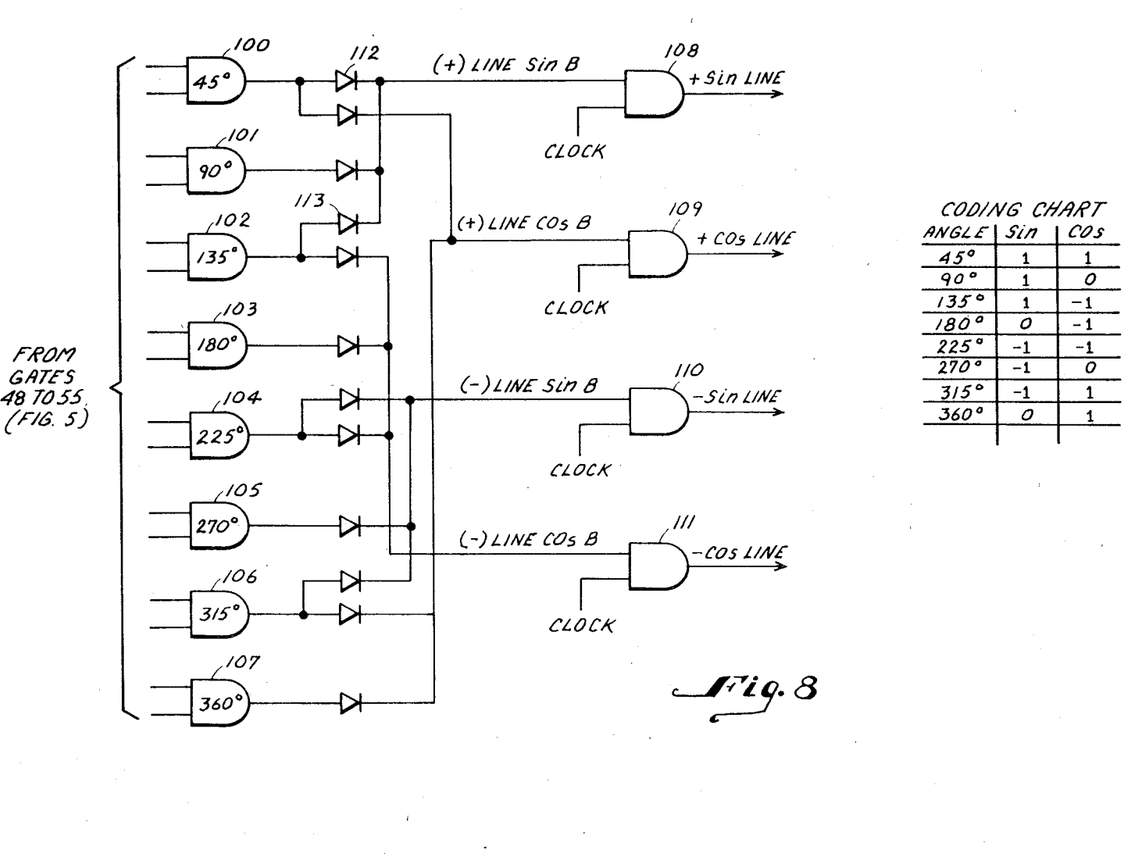
FIG. 8 is a circuit diagram showing an alternate method for providing an octant output signals.

Referring to FIG. 8, there is shown a schematic diagram of the octant coder 89 which is employed in FIG. 7. Essentially, gates designated as 45°-360° and further referenced by numerals 100 to 107 are the same gates as shown in FIG. 5 as gates 40 to 47. Thus each gate as explained produces an output signal indicative of the angle $\delta$ being within one of the octants. Hence gate 100 corresponds to gate 40 of FIG. 4 and produces an output for 45°.

In FIG. 8 the outputs of each gate are coupled through diodes to sampling gates 108 to 111. The sampling gate 108 receives an output from gate 100 and gate 102 which outputs are ANDED by diodes 112 and 113 at one input of gate 108. The other input of gate 108 receives clock pulses indicative of the sampling rate.

Based on the above sampling technique, the output of gate 108 is designated as +sin line. The output of gate 109 is designated as +cos line. The output of gate 110 is −sin line, while the output of gate 111 is −cos line. Also shown in FIG. 8 is the coding chart indicating which lines are high or low and therefore indicating the proper angle. For example, in FIG. 8, there are four coded output lines where a positive (0) pulse will be present. If the phase angle presented to the circuit lines in the octants is indicated, the sine will have the value 0, 1, or −1. If 0, all sine lines will be 0, if +1, the plus sine line will have a positive pulse present. If −1, the negative sine line will have a positive pulse present. The cosine is also represented as 0, 1 or −1 and will correspondingly affect each of the output lines accordingly.

What this circuit accomplishes is that it produces four output lines which are paired. Each pair represents a positive and negative value. Thus a positive pulse on the positive line represents a positive value. A positive pulse on the negative line represents a negative value and no pulse on either line represents an 0. The two pairs of lines each represent a coded value for the sine or cosine of the instantaneous phase of an FM modulated signal at the time when the pulse sampling occurs. Thus the decoder as shown in FIG. 8 which is the decoder 89 of FIG. 7 will sample the angle $\beta$ as indicated by the above equations indicative of the outputs of amplifiers 86 and 87. The angle sensor of FIG. 7 is of the same format as the angle sensor shown in FIG. 3 and essentially the outputs from the comparators of FIG. 3 are necessary to provide octant coding for gates 100–107 as further described in conjunction with FIG. 4.

Figures 9, 10:
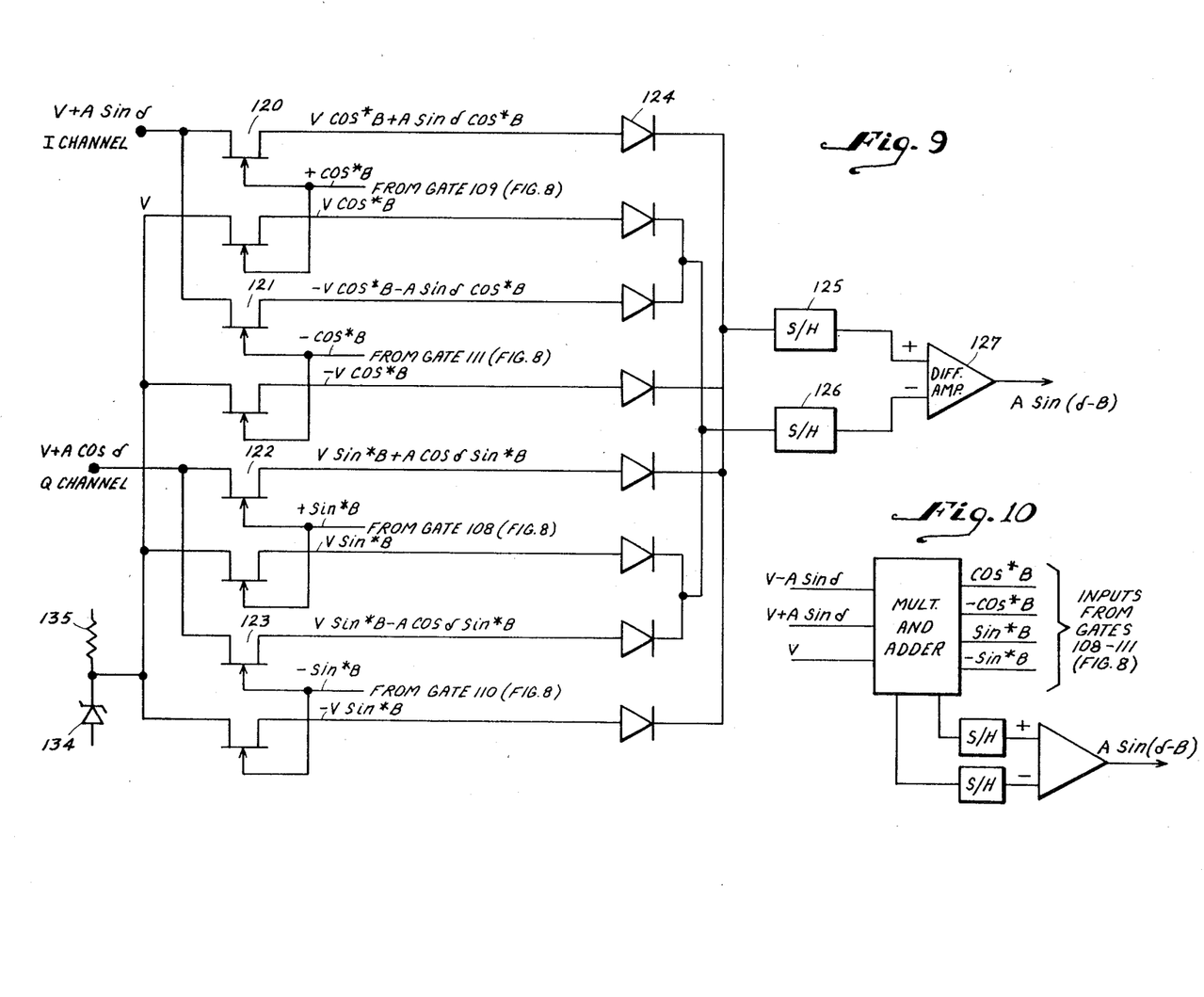
FIG. 9 is a schematic diagram showing a multiplier used in the circuit of FIG. 6.
FIG. 10 is a simplified block diagram of the multiplier and sample and hold circuit used in this invention.

Referring to FIG. 9, there is shown the circuitry necessary to implement the multiplier 92 of FIG. 7. The signals indicative of the I and Q channels from the front end 91 are applied to the source or drain electrodes of FET devices such as 120 and 121 for the I channel while the Q channel signals are applied to the source of train electrodes of FETs 122 and 123. The gate electrode of FET 122 receives +sin* $\beta$, while the gate electrode of FET 120 receives cos* $\beta$. The resulting output signals are shown in FIG. 9. Diodes are employed as diode 124 to isolate and prevent interaction between eight output lines provided by the circuit of FIG. 8. These lines are coupled together and directed as shown to sample and hold circuits 125 and 126. The outputs of the sample and hold circuits are directed to a differential amplifier to produce the following output:

(sin $\delta$)(cos* $\beta$) − (cos $\delta$)(sin* $\beta$)

The four outputs from gates 108, 109, 110, and 111 are the inputs to the multiplier of FIG. 9 as shown on the diagram.

Referring to FIG. 10, there is shown a simplified block diagram of multiplier and adder 92 showing the I and Q input signals on one side and the four output lines from FIG. 8 on the other side. The four output lines from the octant coder 89 are also directed to multiplier 96 which is of the same form as multiplier 92 shown in FIG. 9. The circuit shown in FIG. 9 serves to multiply the signal at the gate electrode of the FET device as 120 with the signal on the source or drain electrode. This is a conventional multiplier configuration. The resultant signal is depicted on the diagram. The product signals are summed via the diodes 124 to obtain the desired output signal for application to the sample and hold circuits to obtain at the output of the differential amplier 127 the demodulated signal.

The multiplier 96 serves to multiply the same signals emanating from the octant coder 89 which signals are smoothed by sample and hold circuits 98 and 97 and the sum taken by amplifier 99 to produce an output proportional to the amplitude modulation. The circuit demodulates AM as well as FM or PM. Also shown in FIG. 9 is a Zener diode 134 which is coupled to a resistor 135 and connected to the line designated by V.

The function of the Zener diode and resistor is as follows. The Zener diode 134 is used to create a reference voltage from which the voltage V is subtracted. The subtraction can be accomplished in a summer which enables one to develop an error voltage which can be used as a feedback voltage for the amplifiers contained in the front end 91. This is similar to control of amplifiers 18 and 19 as described above.

In regard to the above noted scheme, both techniques utilize quantization to 45° accuracy as a matter of convenience. It will be understood that the accuracy could also have been set to plus or minus 11.25° or half that and so on.

Referring to FIG. 3, it is shown that the dividers R, $R_2$, $R_1$ could be replaced by five resistors as $R_1$, $R_2$, $R_N$, $R_2$, $R_1$. In this manner four comparators could be employed instead of two for each divider. Accordingly, the circle shown in FIG. 3 could be broken into 16 segments instead of eight. To implement this configuration, four comparators would have to be added as those shown in FIG. 4 to determine which of the 16 segments the phase angle occupies. This, of course, is completely practical to accomplish and it is felt that this circuit could determine the phase angle between 10× to 100× more accurately than the use of the eight comparators as described above. In any event, it is also understood that the sampling rate can be increased where perfect accuracy is obtained by the averaging method. The outputs shown in FIG. 4 could be further converted into digital form and this would permit further digital processing such as that of taking the successive differences and/or filtering as required to provide a digital output. This could then be used as is or converted to analog form for further use. It is understood that the expressions utilized for signal forms are by way of example and many additional mathematical expressions could be employed to represent the signals utilized herein.

We claim:

1. Apparatus for use in demodulating the information content in the I and Q channel of a zero IF receiving apparatus comprising:
    angle sensing means responsive to said I and Q channel signals for providing at an output angle signals indicative of phase angles associated with said I and Q signals being within specified ranges of angles,
    means responsive to said angle signals to provide an indication of which one of a plurality of octants each of said phase angles is in to specify said angle as one between 0° to 360° for assigning one of a plurality of predetermined angular values to said phase angles as indicative of said octant and means responsive to said assigned angular values to provide at an output a demodulated signal.

2. The apparatus according to claim 1, wherein said plurality of octants comprises eight octants each covering a range of 45 degrees.

3. The apparatus according to claim 1, wherein said predetermined angular values as assigned are 0°, 45°, 90°, 135°, 180°, 225°, 270° and 315°.

4. The apparatus according to claim 1, wherein said information content is AM modulation.

5. The apparatus according to claim 1, wherein said information content is FM modulation.

6. The apparatus according to claim 1, wherein said information content is PM modulation.

7. Apparatus for demodulating the information content contained in the I and Q channel signals of a zero IF receiving apparatus comprising:
    first and second amplifying means with said first amplifier responsive to said signal in said I channel for providing at an output an amplified version of said I channel signal, and with said second amplifier responsive to said signal in said Q channel for providing at an output an amplified version of said Q channel signal,
    angle sensing means responsive to said amplified I and Q channel signals to provide at an output angle signals indicative of a phase angle associated with said I and Q channel signals being within specified ranges of angles,
    octant sensing means responsive to said angle signals to determine which one of a plurality of octants said phase angle is in to specify said phase angle by a predetermined value according to said octant whereby said angle is specified as 360/n, where n is a positive number according to said phase angle as located within one of said octants, and
    means for processing said predetermined values to demodulate the information content in said I and Q channels.

8. The apparatus according to claim 7, wherein said first and second amplifiers are differential amplifiers each having first and second outputs to provide at each output the differential signals indicative of the signal in said respective I or Q channel.

9. The apparatus according to claim 8, wherein said angle sensing means includes a first pair of active devices associated with said I channel each having an input for receiving a separate one of
    said differential signals indicative of said I channel, a second pair of active devices associated with said Q channel and each having an input for receiving a separate one of said differential signals indicative of said Q channel, and voltage divider means for coupling another electrode of one of each pair of devices to the other and a plurality of comparator means coupled to said voltage dividers for providing at an output a signal indicative of said I and Q signals being within a given range of angles.

10. The apparatus according to claim 9, wherein said octant sensing means includes a plurality of coincidence gates each having first and second inputs coupled to respective outputs of said comparator means to provide at an output said predetermined value indicative of said phase angle and a plurality of sampling gates each one associated with one of said coincidence gates and having one input coupled to the output of said associated gate and having another input coupled to a source of sample pulses for causing said gates to provide said output only during the presence of a sampling pulse.

11. The apparatus according to claim 10, further including a separate voltage divider coupled to the ouput of each of said sampling gates whereby each gate has a separate divider associated therewith.

12. The sampled data apparatus according to claim 11, wherein said means for processing said predetermined values includes summing means having a plurality of inputs each one coupled to one associated output of said sampling gates and having an output where said inputs are summed, switching means coupled to said output for switching said output between a first and second terminal, a first sample and hold circuit having an input at said first terminal and a second sample and hold circuit having an input at said second terminal, with the output of said first sample and hold coupled to an input of a differential amplifier and with the output of said second sample and hold coupled to the other input of said differential amplifier, with the output of said differential amplifier providing said demodulated signal.

13. The apparatus according to claim 7, where n is equal to eight.

14. The apparatus according to claim 9, further comprising means coupled between said pairs of active devices for said I and Q channels for devising a voltage indicative of the difference in a DC value associated with said I and Q channels to develop an error voltage and means for applying said voltage to said differential amplifiers associated with said channels to control the gain thereof.

15. Apparatus for use in demodulating the information content in the I and Q channel signals of a zero IF receiving apparatus of the type further employing a voltage controlled oscillator having an output coupled to inputs of first and second mixers, with other inputs of said mixers coupled to the quadrature signals derived from a local oscillator to provide at the outputs of said mixers a I' and Q' channel signal, comprising, angle sensing means responsive to said I' and Q' channel signals to provide at an output angle signals indicative of phase angles associated with said I' and Q' signals being within specified ranges of angles, octant decoder means responsive to said angle signals to provide at outputs thereof an indication of which one of a plurality of octants each of said phase angles is in to specify said phase angle as one between 0° to 360° for assigning one of a plurality of predetermined angular values to said phase angles first multiplying means having first and second inputs adapted to receive said I and Q channel signals and further inputs coupled to said outputs of said octant decoder means to provide at an output product signals indicative of the I and Q signals as modified by the I' and Q' signals, differentiation means coupled to the output of said multiplying means to provide a control signal for said voltage controlled oscillator with said control signal indicative of one type of information content in said I and Q channels.

16. The apparatus according to claim 15, further including second multiplying means having first and second inputs adapted to receive said I and Q channel signals and further inputs coupled to said outputs of said octant decoder means to provide at an output product signals indicative of the I and Q signals as modified by the I' and Q' signals, and summing means coupled to the output of said second multiplying means to provide at an output a demodulated signal indicative of a second type of information content in said I and Q channels.

17. The apparatus according to claim 16, wherein said first type of information content is FM and said second type of information content is AM.

18. The apparatus according to claim 15, wherein said differentiation means includes sample and hold circuit means having an input coupled to the output of said multiplier with a differential amplifier having inputs coupled to the output of said sample and hold means.

19. The apparatus according to claim 15, wherein said octant decoder means includes means for providing an indication of the octant of said phase angle by detecting the sign of the sine or cosine value of said angle signal.

20. The apparatus according to claim 15, wherein said predetermined angular values are 0°, 45°, 90°, 135°, 180°, 225°, 270° and 315°.

21. A method for demodulating the phase information content in a modulated signal having the form of $V + A \sin \delta$ in one channel indicative of a first signal and of $V + A \cos \delta$ indicative of a second signal in another channel, comprising the steps of:

(a) forming a differential signal from each of said channel signals to provide a third signal of the form $V - A \sin \delta$ and a fourth signal of the form $V - A \cos \delta$.

where
  V is a constant
  A is a constant
and
  $\delta$ is a time varying phase function:

(b) combining said first and second signals and said third and fourth signals to provide a series of composite signals each indicative of a given range of angular values indicative of the phase angle of said modulated signals, (c) sampling said series of signals to determine which one of a plurality of octants each of said signals are in, (d) assigning a predetermined value to each of said sampled signals according to said octant determination, (e) processing said assigned values to demodulate said information content.

22. The method according to claim 21, wherein said assigned predetermined values are 0°, 45°, 90°, 135°, 180°, 225°, 270° and 315°.

23. The method according to claim 21, wherein said plurality of octants is 360/n, where n is a positive integer greater than one.

* * * * *